United States Patent
Hofmair

(10) Patent No.: US 8,436,667 B2
(45) Date of Patent: May 7, 2013

(54) METHOD FOR OPERATING A PWM OUTPUT OF A DRIVER FOR A POWER SEMICONDUCTOR

(75) Inventor: Markus Hofmair, Roth (DE)

(73) Assignee: Semikron GmbH & Co., KG, Nürnberg (DE)

( * ) Notice: Subject to any disclaimer, the term of this patent is extended or adjusted under 35 U.S.C. 154(b) by 22 days.

(21) Appl. No.: 13/195,762

(22) Filed: Aug. 1, 2011

(65) Prior Publication Data
US 2012/0200319 A1    Aug. 9, 2012

(30) Foreign Application Priority Data
Jul. 30, 2010 (DE) .......................... 10 2010 038 735

(51) Int. Cl.
*H03K 3/017* (2006.01)
(52) U.S. Cl.
USPC .......................................... 327/175; 327/172
(58) Field of Classification Search .................. None
See application file for complete search history.

(56) References Cited

U.S. PATENT DOCUMENTS

| | | | |
|---|---|---|---|
| 2006/0006741 A1 | 1/2006 | Tassitino | |
| 2006/0043389 A1* | 3/2006 | Morikawa | 257/81 |
| 2008/0044165 A1 | 2/2008 | Miyajima | |
| 2009/0066412 A1* | 3/2009 | Shimizu | 330/10 |
| 2009/0322380 A1 | 12/2009 | Yanagishima | |

FOREIGN PATENT DOCUMENTS
EP    1633046    3/2006

OTHER PUBLICATIONS
EPO Search Report dated Sep. 14, 2012 in EP Ser. No. 11172454.8, corresponding EPO case.

* cited by examiner

*Primary Examiner* — Cassandra Cox
(74) *Attorney, Agent, or Firm* — The Law Offices of Roger S. Thompson

(57) ABSTRACT

A method for outputting an analog value at a PWM output of a driver for a power semiconductor. The method comprises converting the analog value to a PWM signal which has two signal levels and which is at a fixed PWM frequency. For an inactive state of a binary supplementary value the PWM signal is output at the PWM output. For an active value of the supplementary value the PWM signal is output together with a supplementary signal at the PWM output. The current signal level of the PWM signal and the respective other signal level are output alternately as a supplementary signal at a signal frequency greater than the PWM frequency.

5 Claims, 2 Drawing Sheets

METHOD FOR OPERATING A PWM OUTPUT OF A DRIVER FOR A POWER SEMICONDUCTOR

BACKGROUND OF THE INVENTION

1. Field of the Invention

The invention relates to a method for operating a pulse width modulated ("PWM") output of a driver for a power semiconductor.

2. Description of the Related Art

Power semiconductors, for example IGBTs (Insulated Gate Bipolar Transistors), usually require a driver for actuation. The driver converts a low-power logic signal into a high-power switching signal which can then be supplied directly to the switching input of the power semiconductor, e.g., the gate of the IGBT, and ultimately switches the power semiconductor.

In this case, a driver usually performs various ancillary functions in addition to its actual switching function under certain predetermined conditions. For example, a variable having an analog value, such as temperature or voltage, may be measured on the power semiconductor or a yes/no error signal, i.e., a binary supplementary value is produced if the driver or semiconductor fails. Common voltage values in this case are in the range of from approximately 0V to approximately 10V, for example. Both an analog value of this kind and a binary supplementary value are output by the driver. For this purpose, the latter usually outputs the analog value in the form of a PWM output signal. The binary value is output at an additional output. A customer using the driver connects the relevant outputs according to the requirements of the application for further processing of the signals applied thereto. In other words, the output is followed by a transmission link for the circuit logic required by the customer.

The analog value is converted into a PWM signal at a fixed PWM frequency within the driver. In this case, the PWM output has a first (Hi) and a second (Lo) signal level for the PWM signal, between which the PWM output alternates. Since the transmission link also has only the two signal levels, it can be understood to be digital and can be implemented by means of optical fibers, for example. In other words, the analog value to be transmitted or the analog signal is converted into a PWM signal at a fixed frequency by a transmitter. The longer the signal level is Hi within a PWM clock cycle, the higher the analog value to be transmitted.

At the receiver end, i.e., at the end of the transmission link, for example in the circuit connected by the customer, a receiver in turn outputs a defined level for the respective one of the two signal levels. In this case, the receiver may be implemented either in analog form or in digital form. In the case of an analog receiver, a low-pass filter, such as an RC element, is used to smooth the received PWM signal into an analog output value, for example. In the case of digital evaluation, the receiver samples the PWM signal at a known frequency. In this case, the sampling rate of the receiver determines the accuracy thereof.

It is a known practice for the binary supplementary value to be transmitted separately on a second transmission link, which likewise has two signal levels, e.g., a second optical fiber.

While known systems work satisfactorily in most circumstances, there is always a need for improved performance.

SUMMARY OF THE INVENTION

It is therefore an object of the invention to provide an improved method for operating a PWM output of a driver for a power semiconductor.

The object is achieved by a method such as described hereinbelow, in which the analog value to be output by the driver is, as is known, converted into a PWM signal which has a first and a second signal level and which is at a fixed PWM frequency.

According to the inventive method, when the supplementary value is at its first value, the PWM signal is transmitted—as is known—via the transmission link using the two signal levels. The PWM signal is thus output at the PWM output as usual.

However, when the supplementary value assumes its other, that is to say the second, value, the PWM signal is output together with a supplementary signal at the PWM output. In this case, the supplementary signal is formed as follows: a signal frequency greater than the PWM frequency is used to output the first or second signal level, applied as per the specification of the PWM signal, and, in alternating sequence therewith or alternately, the respective other signal level.

In other words, the invention involves the PWM signal being output by the driver as usual so long as the binary supplementary value assumes its first—also called inactive—value. By contrast, when the second value of the supplementary value occurs or is applied, a high-frequency (i.e., a signal frequency greater than the PWM frequency) signal is output in addition to the PWM signal. The additional signal involves the present PWM level being alternated at high frequency with the other level. In particular, the signal frequency is substantially greater than the PWM frequency, that is, greater by a factor of 5, 10, 20, 50, 100 or more, for example.

In one example, the analog value is a temperature or a voltage value determined by the driver on the power semiconductor and the supplementary value is a binary error signal which delivers a zero as the first value indicating error-free operation, and delivers a one as the second value indicating the occurrence of an error.

In other words, the second value of the supplementary value thus involves the PWM signal to date being overlaid with a comparatively high-frequency supplementary signal.

At the end of the transmission link, it is also possible for the total signal that is output at the PWM output to be evaluated in analog and/or digital form. This involves the supplementary signal being separated from the PWM signal, for example by an analog high-pass filter, and both signals being evaluated separately. The supplementary signal can be evaluated digitally at a sampling frequency which is greater than twice the signal frequency, for example. By contrast, the PWM signal is converted back into the analog value by a suitable evaluation method, as is known.

Normally, the supplementary value is of higher priority than the analog value. In the above example it is more important for an error signal to be recognized within a narrow time frame than for the correct temperature also to be known at this time. When sending the supplementary signal, it is therefore tolerable for the analog value, i.e., the evaluation result for the actual PWM signal, to be corrupted at that time. In such a case, the analog value is of subordinate significance, and the information therein can be destroyed or ignored.

It is nevertheless desirable for the information in the analog value not to be destroyed even when the supplementary signal is applied. The output PWM signal is usually converted back into the analog value on a receiver by an evaluation method. The evaluation method is subsequently assumed to be known.

In one preferred embodiment of the method, when the evaluation method is known, the signal levels in the supplementary signal are chosen within a PWM clock cycle on the basis of the evaluation method such that the method for evaluating the signal yields the analog value, regardless of whether the supplementary signal has been modulated onto the PWM signal. In other words, the supplementary signal is designed such that it is mean-free, for example, in respect of the PWM signal and the evaluation method therefor, does not corrupt the result of the evaluation method. The analog value may therefore also still be evaluated or attained during the transmission of the supplementary signal.

Different variants exist for such a design of the supplementary signal, so that the conditions, e.g., the time specifications, according to which the signal level needs to be alternated when the supplementary signal is applied:

In a first variant, the supplementary signal is output exclusively only when the PWM signal assumes either the first or the second signal level. A prerequisite for this is that each PWM clock cycle in the PWM signal has both signal levels. In other words, the supplementary signal is thus transmitted only during one of the Hi and Lo levels of the PWM signal. This variant is an option particularly useful in combination with digital evaluation at the end of the transmission link. In this embodiment, the time limits for the level change in the original PWM signal continue to be observed. Despite the supplementary signal, digital evaluation can thus safely recognize the level limits for the original PWM signal within the PWM clock cycle. The duty cycle of the PWM signal, and hence the analog value, can then be reconstructed correctly.

However, a drawback in this variant is that the transmission and detection of a signal change in the supplementary signal may possibly be delayed by the maximum duration of the Hi or Lo level of the PWM signal, that is to say at most by approximately one PWM clock cycle. This variant is thus not suited to applications in which knowledge of the presence of the supplementary value is particularly time-critical, as where the supplementary value represents a crucial or catastrophic error condition.

In one alternative embodiment, which is an option particularly for the analog evaluation at the end of the transmission link, the supplementary signal is chosen such that, within a single PWM clock cycle, the signal components removed by the supplementary signal in the time interval of the first signal level of the PWM signal are restored using the signal components added by the supplementary signal at the second signal level of the PWM signal.

In other words, when the supplementary signal is applied, the high-frequency changes in the signal levels are selected such that the signal content that is relevant for reconstruction of the analog value, particularly the integral value, for example, is retained under a signal profile during a PWM clock cycle.

By way of example, applying the supplementary signal at the Hi level of the PWM signal also produces Lo levels which diminish the integral value covered by the signal compared to the original PWM signal. At the Lo level of the original PWM signal, the supplementary signal therefore produces additional Hi levels in the remaining course of the PWM clock cycle which equalize the integral value diminished during the beginning of the PWM clock cycle.

By way of another example, when the PWM signal is subjected to low-pass filtering, this variant of the inventive method is always provided with the value of the original PWM signal within a single PWM clock cycle even when the supplementary signal is applied. In other words, the supplementary signal is attuned to the PWM signal such that the signal content thereof based on the evaluation remains unchanged and hence the evaluation method delivers a true value of the supplementary signal at the output.

In a further preferred embodiment of the method, the signal frequency of the supplementary signal is varied on the basis of a further supplementary information item. In this refinement, the binary supplementary signal is not simply transmitted as active or inactive. An appropriate choice of different signal frequencies additionally allows different values of a supplementary signal to be transmitted. Ideally, finely stepped or continuous alteration of the signal frequency also allows—in addition to the supplementary value and at least as an alternative to the original analog value—a further analog value, coupled to the supplementary value. The further analog value may be transmitted in the form of a frequency coding of the second supplementary signal via the same transmission link. However, the supplementary signal is transmitted only if the supplementary value is active.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, in which like numerals represent like elements or processes.

DETAILED DESCRIPTION OF THE PRESENTLY PREFERRED EMBODIMENTS

Figure 1:
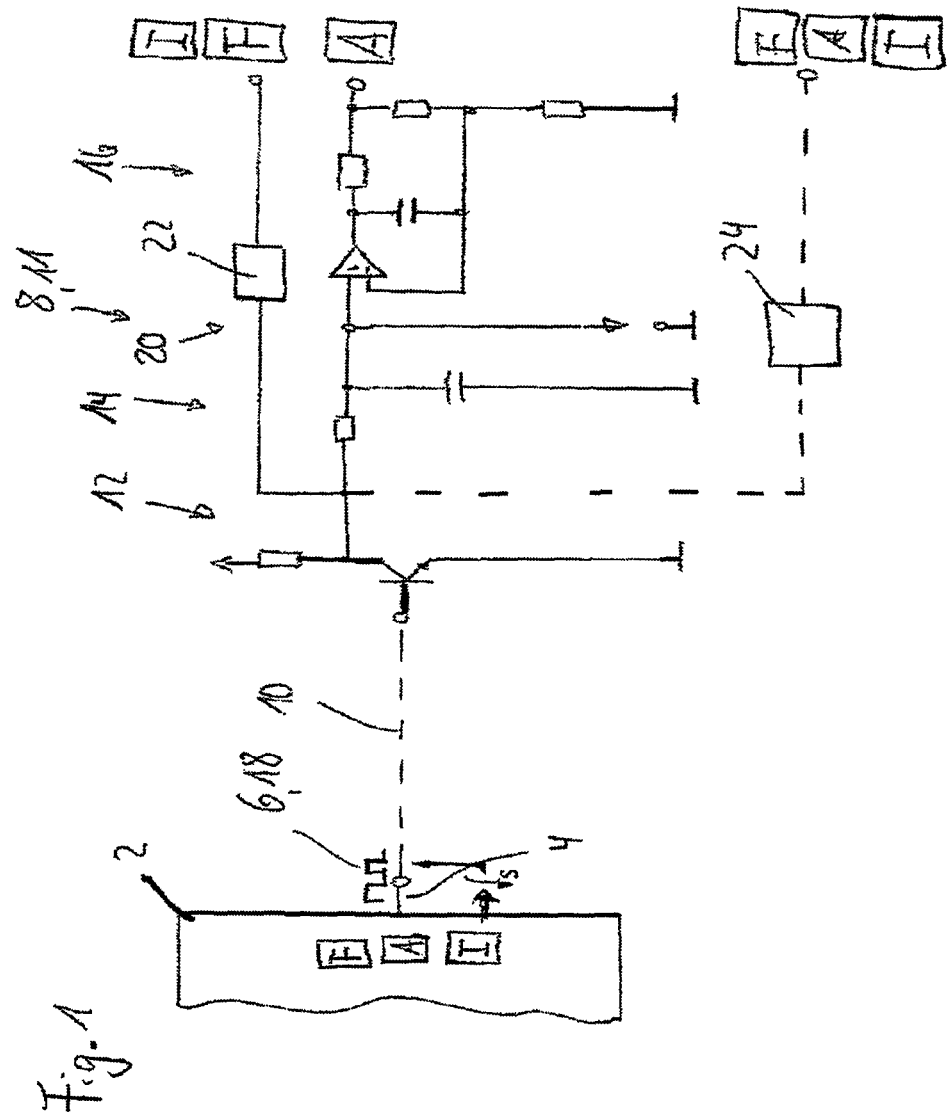
FIG. 1 is a schematic of a driver according to the invention with an evaluation circuit.

FIG. 1 shows a driver 2 for a power semiconductor—not shown—having a PWM output 4. PWM output 4 is intended to be used to output a temperature for the power semiconductor as an analog value A in the form of a PWM signal 6. The output, i.e., the details such as timing, etc., of PWM signal 6 is effected on the basis of a specification by the manufacturer of driver 2. FIG. 1 furthermore shows an evaluation circuit 8 in the form of a receiver 11 which a customer or a purchaser of the driver 2 designs or sets up to convert PWM signal 6 back into analog value A. PWM signal 6 is transmitted, preferably via an optical fiber, as transmission link 10. Evaluation circuit 8 comprises a reception amplifier 12 connected to transmission link 10, an analog low-pass filter 14 and an analog amplifier 16. Evaluation circuit 8 thus operates in analog fashion.

Figure 2:
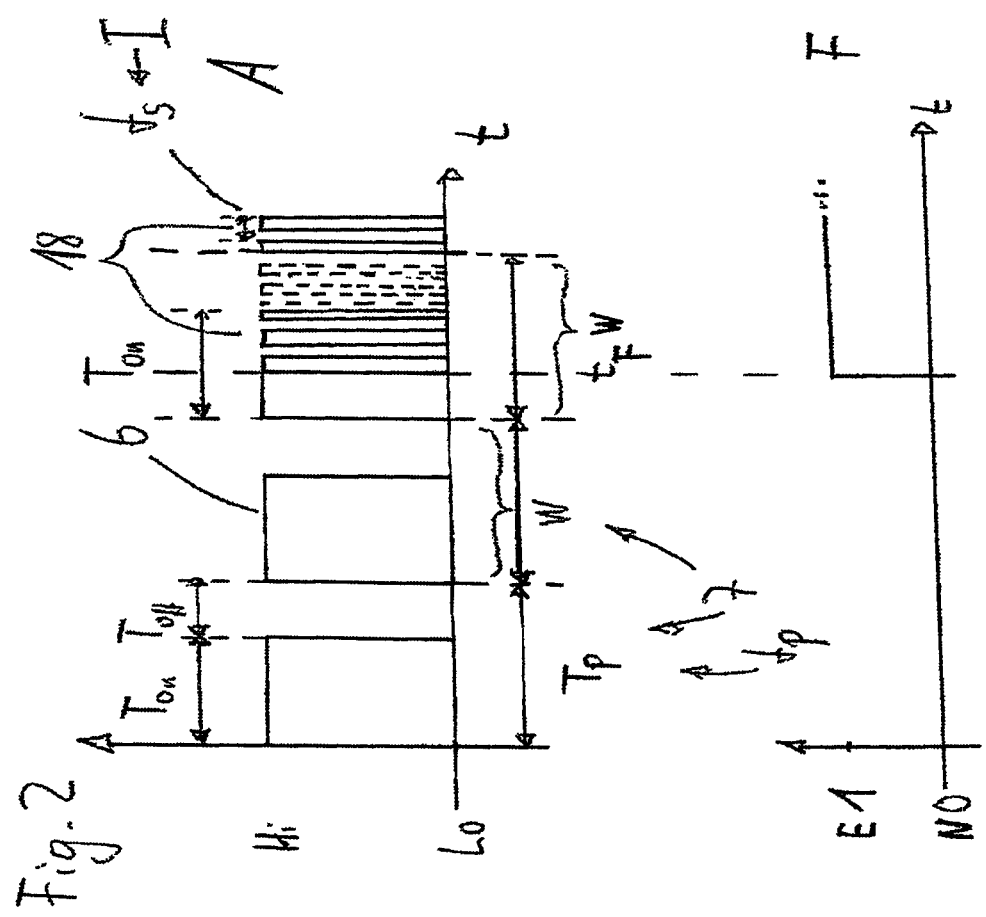
FIG. 2 is a schematic of a PWM signal with a supplementary signal.

FIG. 2 shows PWM signal 6 in detail over time t using the example of the transmission of a twelve-bit value, i.e., of values between 0 and $2^{12}-1=4095$. By way of example, a temperature of 0° C. in this case corresponds to a value of 0, and a temperature of 300° C. corresponds to a value of 4095. FIG. 2 shows the transmission of an analog value of 200° C. as the value 2730. PWM signal 6 has a constant PWM frequency $f_p$, i.e., each PWM clock cycle 7 has the same period duration $T_p$. According to the known PWM method, a first, high signal level Hi is therefore applied within a PWM clock cycle for an on time $T_{on}$ of $2730/4095*T_p$, and a second, low signal level Lo is applied for the remaining period, that is to say the off time $T_{off}=T_p-T_{on}=4095-(2730/4095*T_p)$.

In addition, driver 2 furthermore needs to output a binary supplementary value F, namely an error signal which can assume a first value N of zero (indicating that there is no error)

and a second value E of one (indicating the presence of an error condition). According to the invention, the output is likewise transmitted in PWM output 4.

In PWM signal 6 in FIG. 2, supplementary value F is initially inactive, i.e., it has its first value N equal to zero. Not until an error condition is present, at an error time $t_F$, does the need to communicate the existence of the error condition arise in driver 2. According to the invention, a supplementary signal 18 is therefore output starting at error time $t_F$, that is to say when the error signal F becomes active or assumes its second value E (equal to one). On the basis of this supplementary signal 18, the second signal level of PWM signal 6 varies at a signal frequency $f_S$, which is greater than the PWM frequency $f_p=1/T_p$, to alternately transmit the present signal level Hi of PWM signal 6—which signal level is valid on the basis of the original PWM signal—and, in alternating sequence therewith, the other level—in this case Lo—via transmission link 10. This is done up to the end of on time $T_{on}$. At the end of on time $T_{on}$, the transmission of supplementary signal 18 is interrupted before the next PWM clock cycle to keep the signal at Lo.

As an alternative to the analog variant of the signal evaluation with a low-pass filter 14 and a high-pass filter 22 shown in FIG. 1, it is also possible for digital evaluation—shown in dashes—by a sampling circuit 24 to take place which can then output both analog value A and the detected supplementary signal F.

Since, on the basis of the above, the PWM information in the signal has not been destroyed, that is to say that the off time $T_{off}$ can be clearly recognized, analog value A is retained. It is thus still possible for evaluation circuit 12 to output the correct analog value A. For the case of digital evaluation, the limit for on time $T_{on}$ is thus observed, so that the analog value A can be correctly reconstructed.

The supplementary signal F is evaluated in the aforementioned analog variant of evaluation circuit 18 by a high-pass branch 20 which branches off downstream of a reception amplifier 21 and which has a high-pass filter 22 as shown in FIG. 1.

In one alternative embodiment, supplementary signal 18 (shown in dashes) is also continued during off time $T_{off}$. In other words, the insertion of additional pulses of supplementary signal 18 in off time $T_{off}$ maintains the integral value W of the total signal per PWM clock cycle. That is to say that the Hi signal components which are "missing" in on time $T_{on}$ are provided later or added during off time $T_{off}$ to take analog evaluation back to the same analog value A. The integral area—covered by the signal profile—of the original PWM signal and that of the signal profile to which the supplementary signal has been added are then the same.

In FIG. 2, supplementary signal 18 has a fixed signal frequency $f_S$. In an alternative embodiment of the invention, which is presented only symbolically, the signal frequency $f_S$ can also be altered using a supplementary information item I. In other words, supplementary information I is then frequency-encoded at the signal frequency $f_S$. At the receiver or customer end, the supplementary information I can then be reconstructed again from the received PWM signal 6 with supplementary signal 18 in the high-pass branch 20 or in the sampling circuit 24. This is a well-known procedure involving an analog low-pass filter and analog amplifier as shown in FIG. 2. One of ordinary skill in the art would be able to design suitable components thereof without undue experimentation to co-operate with the remaining components of the specific application with which the inventive method is used.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for operating a PWM output of a driver for a power semiconductor, the PWM output including a PWM signal and a binary supplementary value under predetermined operating conditions, the method comprising:
converting an analog value to be output by the driver into a PWM signal which has a first (Hi) and a second (Lo) signal level and which is at a known PWM frequency, and
for a first value of the binary supplementary value, outputting the PWM signal at the PWM output,
for a second value of the binary supplementary value, outputting the PWM signal at the PWM output together with a supplementary signal;
wherein the first (Hi) or second (Lo) signal level determined on the basis of the PWM signal and the respective other signal level (Lo, Hi) are output in alternating sequence as said supplementary signal at a signal frequency greater than said known PWM frequency.

2. The method of claim 1, wherein the output PWM signal is converted back into said analog value on a receiver by a predetermined evaluation method, in which the signal levels (Hi, Lo) in the supplementary signal are chosen within a PWM clock cycle on the basis of the evaluation method such that said analog value is retained as the result of the evaluation method.

3. The method of claim 2, wherein each PWM clock cycle has both signal levels (Hi, Lo), in which the supplementary signal is output exclusively only when the PWM signal adopts one of said first (Hi) and said second (Lo) signal levels.

4. The method of claim 2, in which the supplementary signal is chosen such that within a single PWM clock cycle, the signal components removed by the supplementary signal at said first signal level (Hi) of the PWM signal are restored using the signal components added by the supplementary signal at said second signal level (Lo) of the PWM signal to thereby restore said supplementary signal.

5. The method according to claim 1, in which the signal frequency of the supplementary signal is altered on the basis of a supplementary information item.

* * * * *